United States Patent
Ueno

(10) Patent No.: US 10,230,314 B2
(45) Date of Patent: *Mar. 12, 2019

(54) POWER GENERATION ELEMENT AND ACTUATOR USING STRUCTURE OF SAID POWER GENERATION ELEMENT

(71) Applicant: NATIONAL UNIVERSITY CORPORATION KANAZAWA UNIVERSITY, Kanazawa-shi, Ishikawa (JP)

(72) Inventor: Toshiyuki Ueno, Kanazawa (JP)

(73) Assignee: NATIONAL UNIVERSITY CORPORATION KANAZAWA UNIVERSITY, Kanazawa-shi (JP)

( * ) Notice: Subject to any disclaimer, the term of this patent is extended or adjusted under 35 U.S.C. 154(b) by 213 days.

This patent is subject to a terminal disclaimer.

(21) Appl. No.: 15/126,554

(22) PCT Filed: Feb. 25, 2015

(86) PCT No.: PCT/JP2015/055368
§ 371 (c)(1),
(2) Date: Sep. 15, 2016

(87) PCT Pub. No.: WO2015/141414
PCT Pub. Date: Sep. 24, 2015

(65) Prior Publication Data
US 2017/0093306 A1    Mar. 30, 2017

(30) Foreign Application Priority Data

Mar. 17, 2014 (JP) ................................ 2014-053551

(51) Int. Cl.
*F03G 7/08* (2006.01)
*H02K 1/34* (2006.01)
(Continued)

(52) U.S. Cl.
CPC ............... *H02N 2/188* (2013.01); *F03G 7/08* (2013.01); *H01L 41/12* (2013.01); *H01L 41/125* (2013.01); *H02K 1/34* (2013.01); *H02N 2/186* (2013.01)

(58) Field of Classification Search
CPC .......... H02N 2/188; H02N 2/186; H02K 1/34; F03G 7/08; H01L 41/125; H01L 41/12
(Continued)

(56) References Cited

U.S. PATENT DOCUMENTS 9,461,237 B2 * 10/2016 Ueno .................... H01L 41/125
9,571,011 B2 * 2/2017 Ueno .................... H01L 41/125
(Continued)

FOREIGN PATENT DOCUMENTS

EP        2573931 B1    9/2015
JP        1977162132 U   8/1977
(Continued)

OTHER PUBLICATIONS

International Search Report (ISR) dated May 12, 2015, issued for International application No. PCT/JP2015/055368.

*Primary Examiner* — Forrest M Phillips
(74) *Attorney, Agent, or Firm* — Law Office of Katsuhiro Arai

(57) ABSTRACT

A power generation element of inverse magnetostrictive type has: a first power generation part including a first magnetostrictive rod made of magnetostrictive material, a first coil wound around the first magnetostrictive rod, and a first magnetic rod having appropriate rigidity and a shape to apply a uniform compressive force or tensile force to the first magnetostrictive rod and being placed in parallel with the first magnetostrictive rod; a frame made of magnetic material bent in a substantially U shape, whose one end and other end across the bent location constitute a fixed end and free (Continued)

end, respectively; and a magnet. The power generation element can suppress the loss of kinetic energy while vibrating so that vibration will last long. The power generation element can be used in an actuator.

10 Claims, 9 Drawing Sheets

(51) Int. Cl.
*H02N 2/18* (2006.01)
*H01L 41/12* (2006.01)

(58) Field of Classification Search
USPC .......................................................... 310/26
See application file for complete search history.

(56) References Cited

U.S. PATENT DOCUMENTS

| | | | |
|---|---|---|---|
| 2013/0140919 A1* | 6/2013 | Ueno | ................... H01L 41/125 310/26 |
| 2014/0097709 A1 | 4/2014 | Ueno et al. | |
| 2014/0346902 A1* | 11/2014 | Ueno | ................... H01L 41/125 310/26 |

FOREIGN PATENT DOCUMENTS

| | | | | |
|---|---|---|---|---|
| JP | H17163121 A | 6/1995 | | |
| JP | 4905820 B2 | 3/2012 | | |
| JP | 2013118766 A | 6/2013 | | |
| JP | 201418006 A | 1/2014 | | |
| JP | WO2014017414 | * | 1/2014 | ........... H01L 41/125 |
| WO | 2011158473 A1 | 12/2011 | | |

* cited by examiner

[FIG. 1]
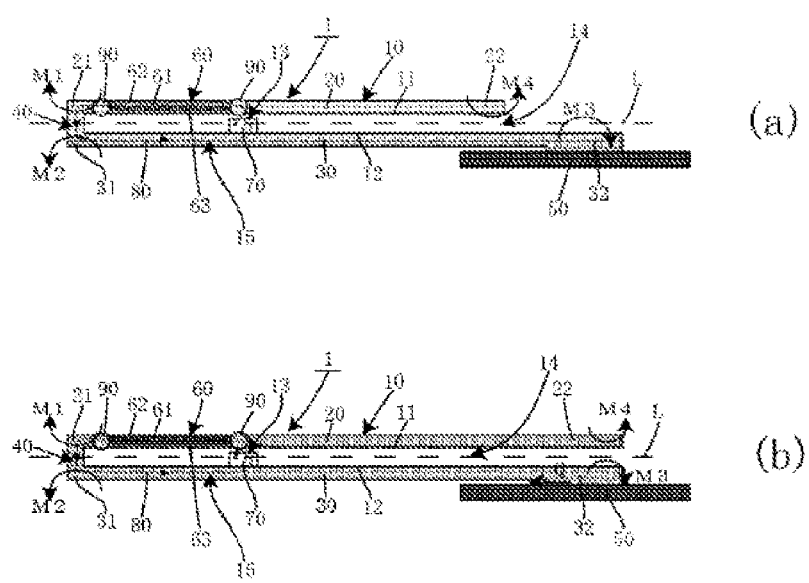

[FIG. 2]
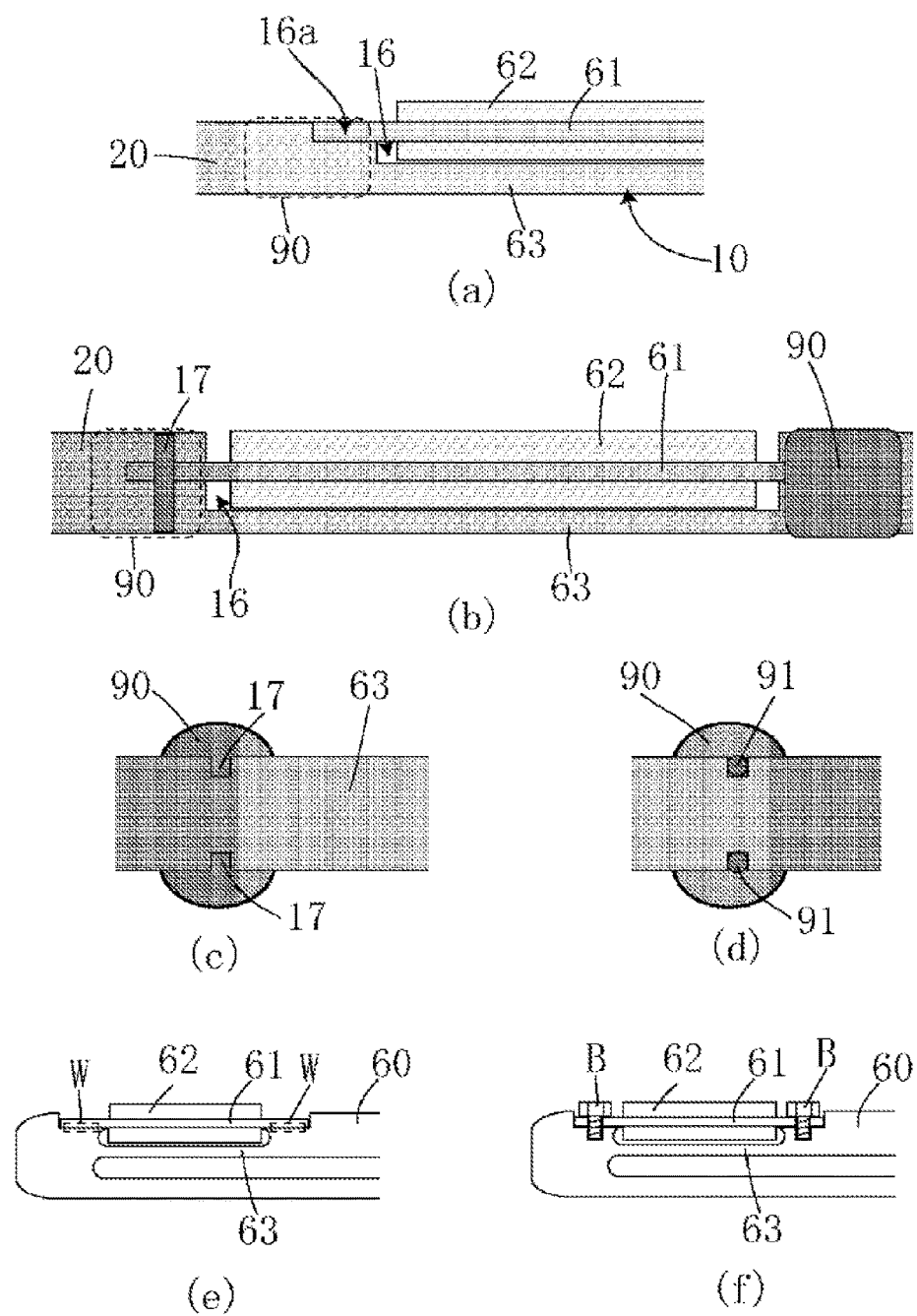

[FIG. 3]
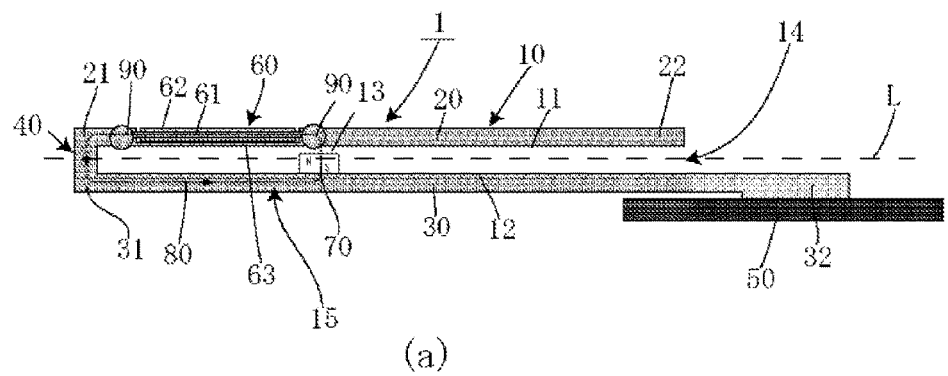
(a)
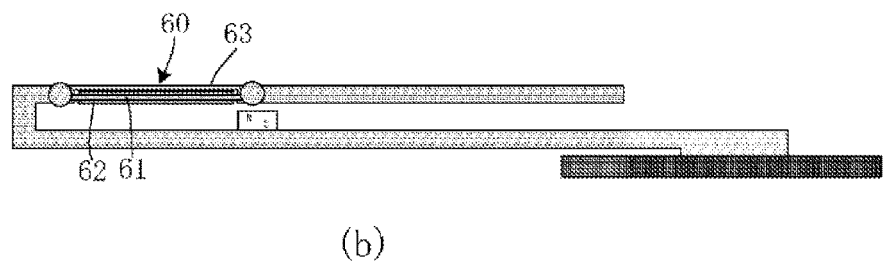
(b)
[FIG. 4]
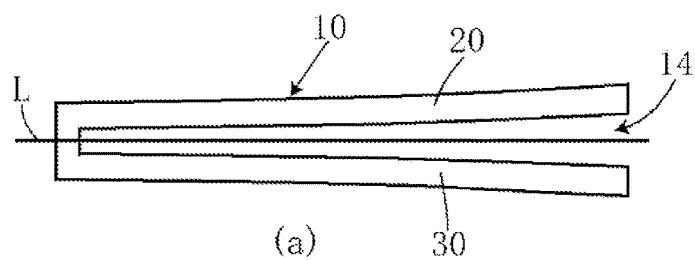
(a)
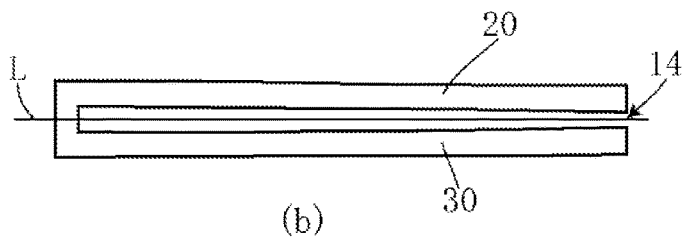
(b)

[FIG. 5]
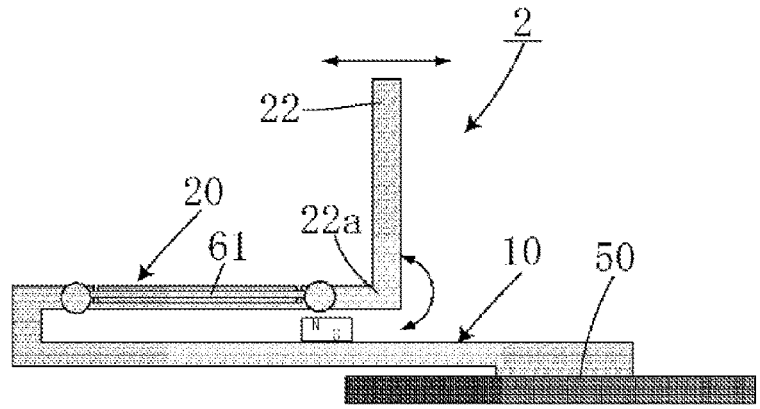
[FIG. 6]
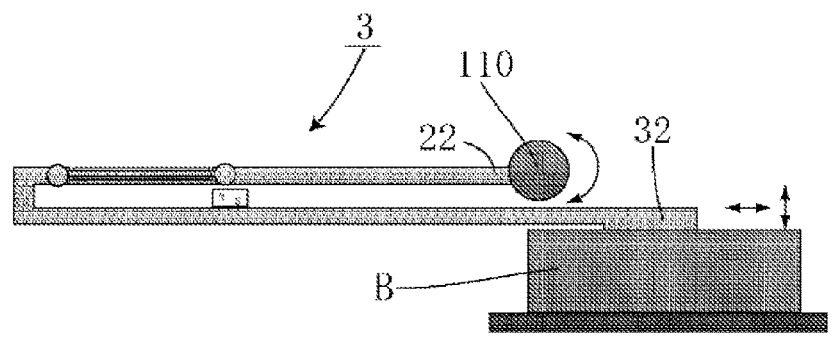
(a)
(b)
[FIG. 7]
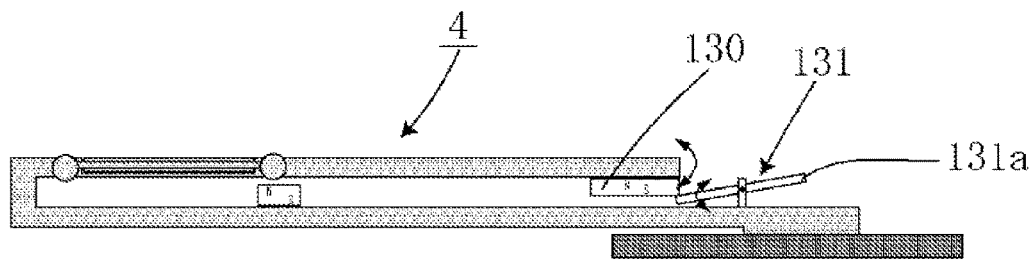

[FIG. 8]
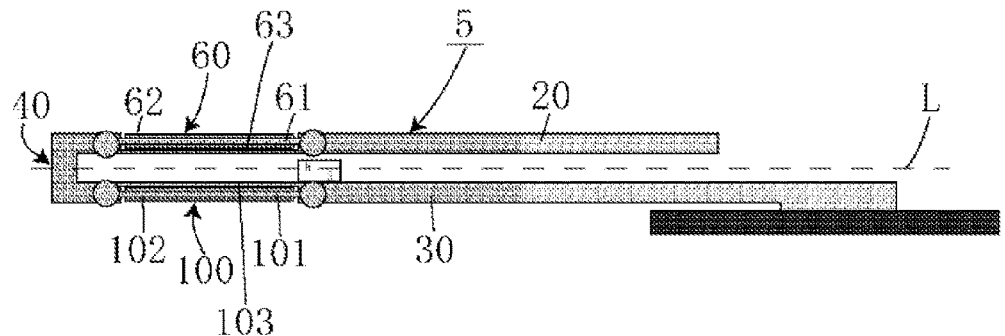
[FIG. 9]
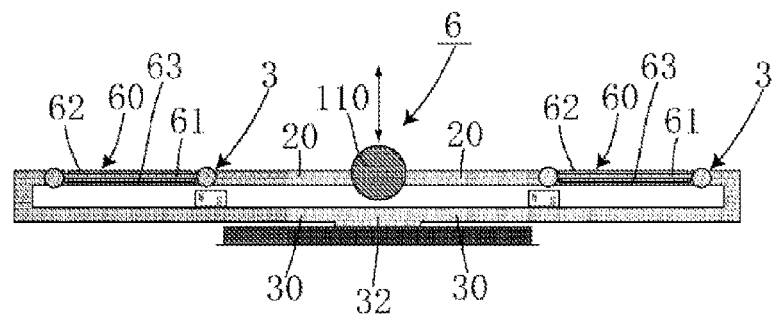
[FIG. 10]
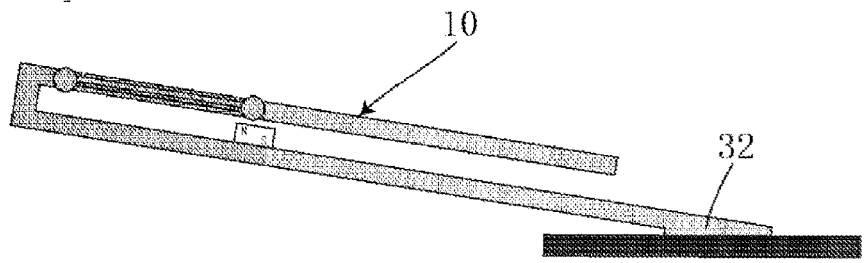
[FIG. 11]
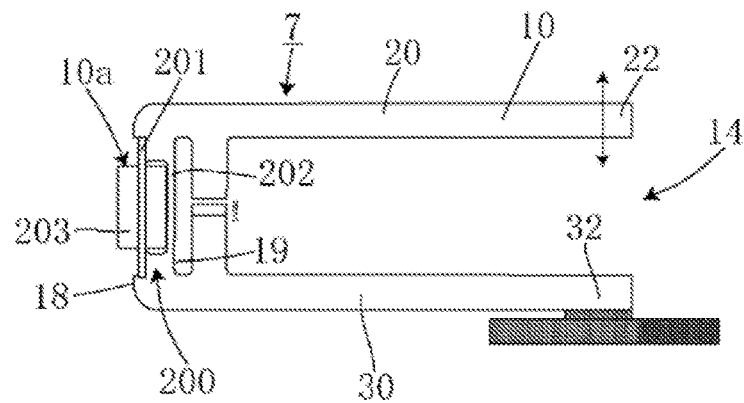

[FIG. 12]
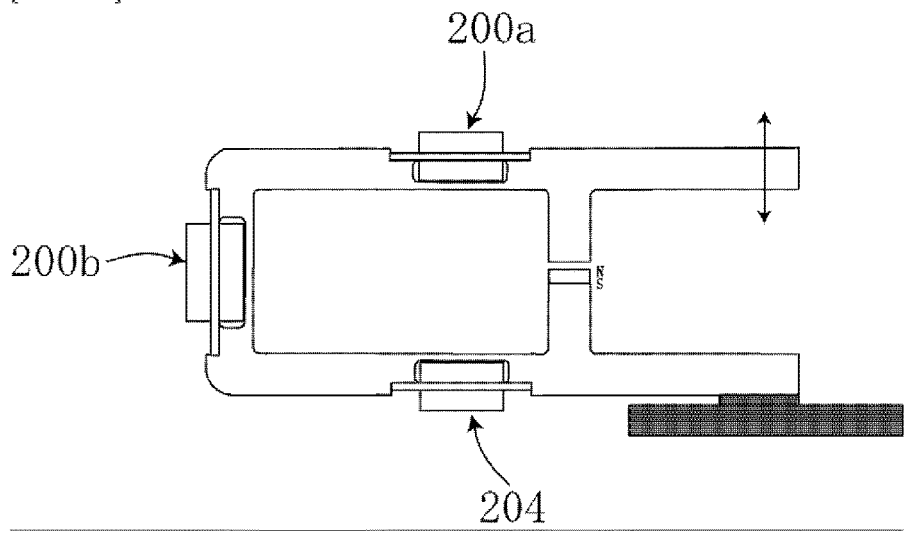
[FIG. 13]
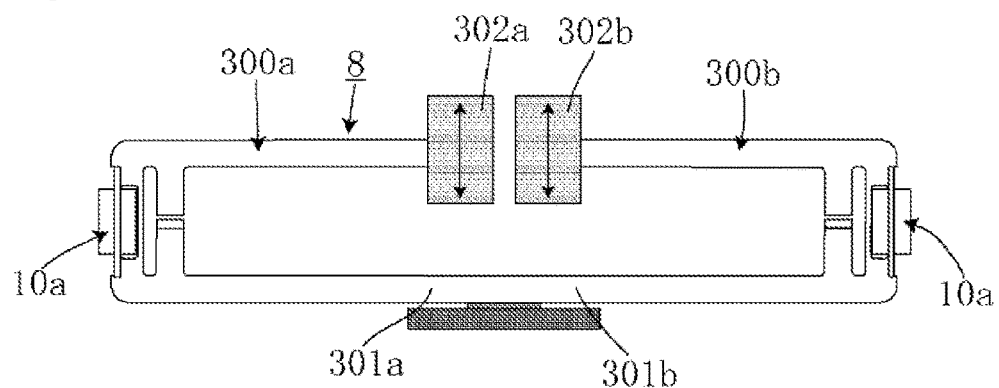
[FIG. 14]
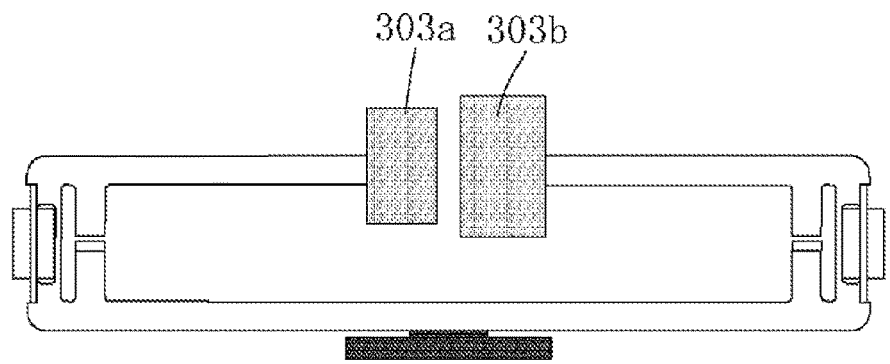

[FIG. 15]
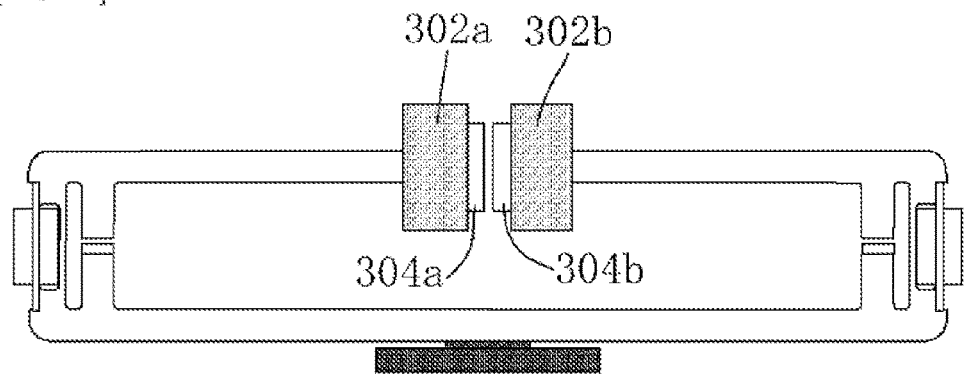
[FIG. 16]
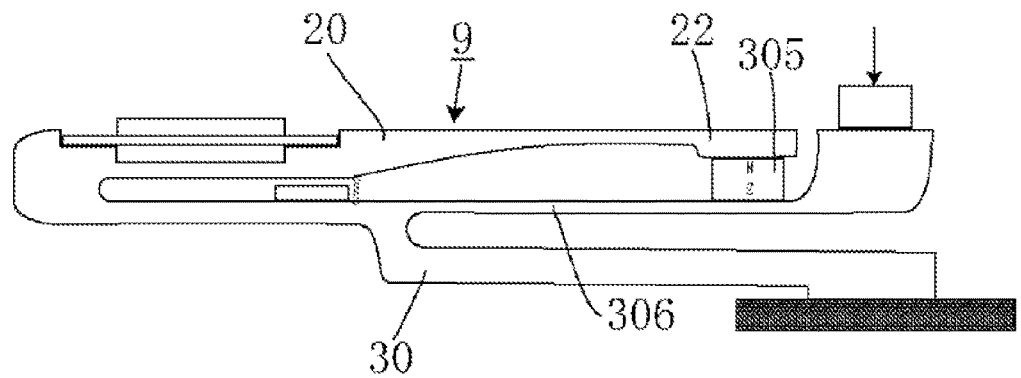
[FIG. 17]
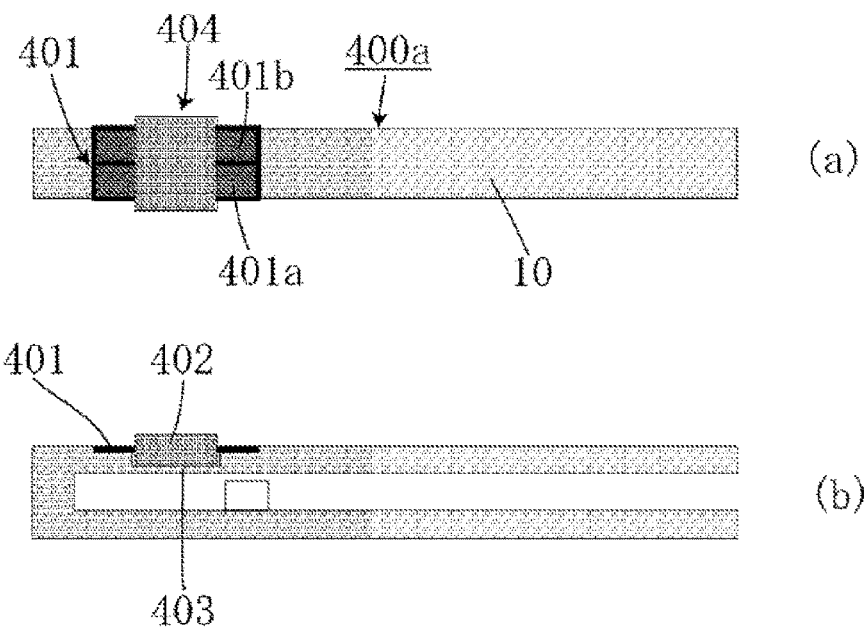

[FIG. 18]
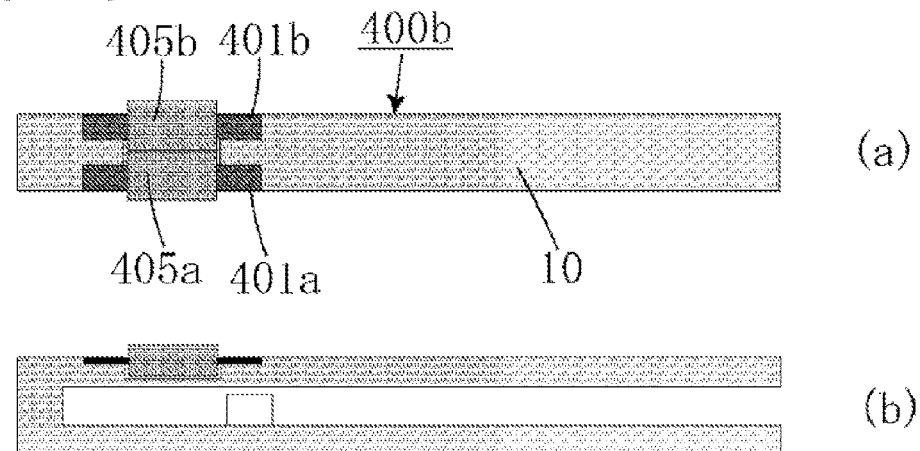
[FIG. 19]
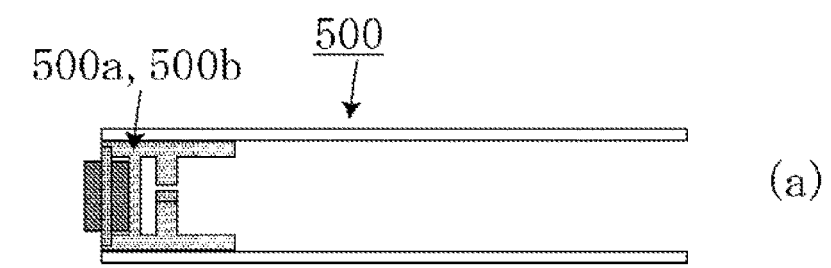
[FIG. 20]
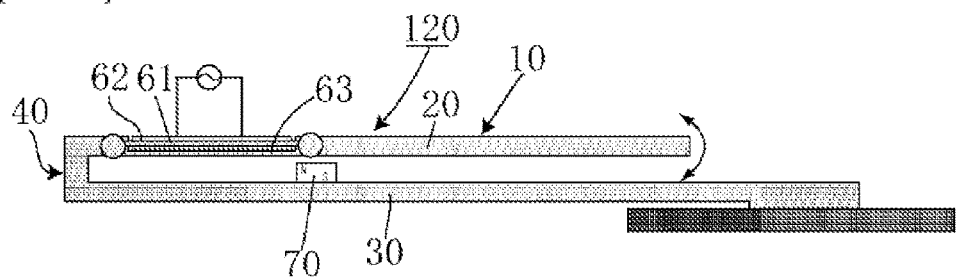

[FIG. 21]
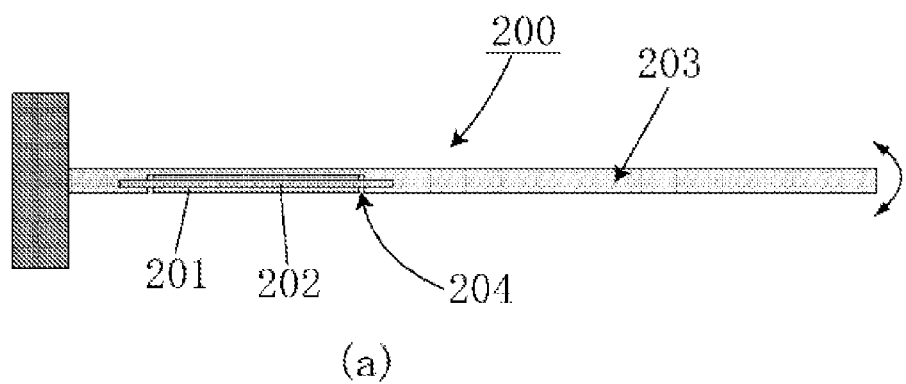
(a)
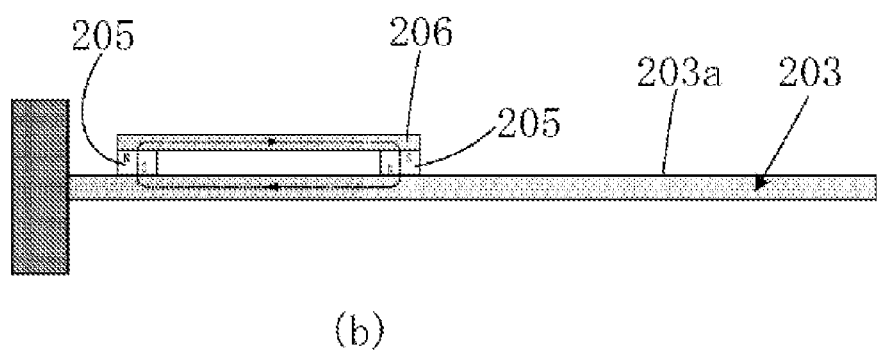
(b)

US 10,230,314 B2

POWER GENERATION ELEMENT AND ACTUATOR USING STRUCTURE OF SAID POWER GENERATION ELEMENT

This application is the U.S. National Phase under 35U.S.C. § 371 of International Application PCT/JP2015/055368, filed Feb. 25, 2015, which claims priority to Japanese Patent Application No. 2014-053551, filed Mar. 17, 2014. The International Application was published under PCT Article 21(2) in a language other than English.

TECHNICAL FIELD

The present invention relates to a power generation element, etc., using vibration, and more specifically to a power generation element of inverse magnetostrictive type made of magnetostrictive material as well as an actuator using the structure of this power generation element.

BACKGROUND ART

Technologies to generate power using vibration available everywhere are being developed of late, one of which is technology that uses the magnetostrictive effect of a ferromagnetic body.

The magnetostrictive effect refers to an effect whereby a ferromagnetic body deforms when a magnetic field is applied to it (when the ferromagnetic body is magnetized), and a material that undergoes a large amount of deformation due to the magnetostrictive effect is called "magnetostrictive material."

A magnetostrictive material also demonstrates the inverse magnetostrictive effect, whereby it deforms due to a compressive/tensile stress generating inside as a result of application of an external force, thereby causing its magnetization (magnetic flux) to change significantly, and, for example, some materials are subject to a change of 1 Tesla or more in its magnetic flux when a compressive force is received. Power generation elements using the temporal change in magnetic flux caused by the inverse magnetostrictive effect, are drawing attention because of their ability to generate power at high efficiency in response to application of a small external force.

The basic structure of a power generation element developed by the inventor of the present application, is explained by citing examples (refer to FIGS. 1 and 2 of Patent Literature 1). This power generation element has a parallel beam structure constituted by arranging, in parallel in the left/right direction within a horizontal plane, two magnetostrictive rods around which a coil is wound, with the front and rear ends of the rods joined to a yoke. Additionally, permanent magnets are magnetized near the front and rear ends of each magnetostrictive rod, and a back yoke is passed between the front and rear permanent magnets. The purpose of the back yoke is to increase the bias magnetization of the magnetostrictive rod, and as the magnetic flux generated by the permanent magnets passes through each magnetostrictive rod and back yoke, one magnetic circuit is formed.

Assume this power generation element has a cantilever beam structure where one end of it is a fixed end; if the free-end side is curved by applying an external force to this side within the horizontal plane, for example, a compressive force applies to the magnetostrictive rod on the right side, in its axis direction, and the magnetic flux decreases due to the inverse magnetostrictive effect, while a tensile force applies to the magnetostrictive rod on the left side, in the axis direction, and the magnetic flux increases due to the inverse magnetostrictive effect. The mechanism is that, as explained above, applying an external force (vibration) to a power generation element of cantilever beam structure within the horizontal plane causes the magnetic flux passing through each magnetostrictive rod to change in an alternating manner, and accordingly voltage (electromotive force) is generated in a coil based on the law of electromagnetic induction that voltage generates in proportion to temporal change in magnetic flux, and this voltage is retrieved as electrical energy.

BACKGROUND ART LITERATURE

Patent Literature

Patent Literature 1: Japanese Patent No. 4905820

SUMMARY OF THE INVENTION

Problems to be Solved by the Invention

Next, the problems of the prior art mentioned above are explained by also referring to a variation example of the power generation element (refer to FIG. 21).

This power generation element 200 has a cantilever beam structure where one magnetostrictive rod 202 around which a coil 201 is wound is fixed inside a concave part 204 of a straight frame 203, and one end of the frame 203 constitutes a fixed end. Additionally two permanent magnets 205 are magnetized on a side face 203a of the frame, and a back yoke 206 is passed between these permanent magnets 205 to form one magnetic circuit comprising the magnetostrictive rod 202, permanent magnets 205 and back yoke 206.

One problem of the power generation element disclosed in Patent Literature 1 and FIG. 21 above is that, because it has a cantilever beam structure where the overall shape is straight and one end constitutes a fixed end, insufficient supporting of the fixed end will cause the so-called "fixed-end loss," representing partial dissipation, to the outside, of the kinetic energy needed to vibrate the power generation element as the fixed end deforms, in which case vibration will not last long.

In addition, further research conducted by the inventor of the present application revealed that the fixed-end loss is caused by a bending moment and shearing force. In other words, it was revealed that the kinetic energy needed to vibrate the power generation element dissipates partially to the outside as the fixed end deforms due to a bending moment or shearing force, and vibration does not last long because of this fixed-end loss.

Also, the permanent magnets are magnetized near the magnetostrictive rod by utilizing their magnetic force without using adhesive, etc., which means that an inertial force acts upon the permanent magnets while the entire power generation element is vibrating, and this causes friction between the contact surfaces of the main body side of the power generation element and of the permanent magnet. This friction causes the kinetic energy of the power generation element to dissipate partially as thermal energy, the result of which is a problem that vibration does not last long.

Furthermore, when the front and rear ends of the magnetostrictive rod are fixed to the concave part of the yoke or frame, normally the magnetostrictive rod is inserted into a groove provided in the yoke or the concave part of the frame and then fixed using adhesive; if a large amount of adhesive is used or otherwise adhesive flows out of the groove, however, it may spread to the coil and cause the magnetostrictive rod and coil to adhere together. Because of this, kinetic energy of the power generation element is partially transmitted as kinetic energy of the coil, the result of which is a problem that vibration of the power generation element does not last long.

In consideration of these problems, an object of the present invention is to provide a power generation element that can suppress the loss of kinetic energy while vibrating so that vibration will last long, as well as an actuator using the structure of this power generation element.

Means for Solving the Problems

The power generation element of inverse magnetostrictive type as proposed by the present invention has: a first power generation part comprising a first magnetostrictive rod made of magnetostrictive material, a first coil wound around the first magnetostrictive rod, and a first magnetic rod having appropriate rigidity and shape to apply a uniform compressive force or tensile force to the first magnetostrictive rod and placed in parallel with the first magnetostrictive rod; a frame made of magnetic material bent in a substantially U shape, whose one end and other end across the bent location constitute a fixed end and free end, respectively; and a magnet; wherein the power generation element is characterized in that: the first power generation part is installed on the free-end side and/or bent location of the frame; the magnet is placed only on one of the two opposing inner side faces of the frame, so that a part of the frame functions as a back yoke and a gap is also formed between the magnet and the inner side face on which the magnet is not placed; and the frame on the free-end side and frame on the fixed-end side vibrate together when an external force is applied.

Additionally, the power generation element is characterized in that, when the first power generation part is installed on the free-end side of the frame, the power generation element has a second power generation part comprising a second magnetostrictive rod made of magnetostrictive material, a second coil wound around the second magnetostrictive rod, and a second magnetic rod having appropriate rigidity and shape to apply a uniform compressive force or tensile force to the second magnetostrictive rod and placed in parallel with the second magnetostrictive rod; the second power generation part is installed on the fixed-end side of the frame; and the first magnetostrictive rod, first magnetic rod, second magnetostrictive rod, and second magnetic rod are placed in line symmetry where the axis of symmetry is a straight line that runs through the bent location and divides the frame equally into the free-end side and fixed-end side.

Additionally, the power generation element is characterized in that, when the first power generation part is installed on the free-end side of the frame, the magnetostrictive rod is placed at a position farther away than the magnetic rod from the straight line that runs through the bent location and divides the frame equally into the free-end side and fixed-end side.

Additionally, the power generation element is characterized in that, when the first power generation part is installed on the bent location of the frame, the magnetostrictive rod is placed on the outer side face of the frame, while the magnetic rod is placed on the inner side face of the frame.

Additionally, the power generation element is characterized in that the magnetostrictive rod is joined to the frame by soldering, brazing, welding, bolting, or a combination of any of the foregoing.

Additionally, the power generation element is characterized in that, when placed so that the longitudinal direction of the frame lies roughly horizontal, a weight is attached to the end on the free-end side immediately above the fixed end.

Additionally, the power generation element is characterized in that it has two such power generation elements and the free-end sides and fixed-end sides of the frames of the respective power generation elements are connected together, so that the two power generation elements deform symmetrically across the connected locations.

The actuator proposed by the present invention has a structure identical to that of the power generation element, and is characterized in that, when electrical current is supplied to the coil, the magnetostrictive rod extends/contracts to cause the frame on the free-end side to vibrate.

Effects of the Invention

According to the present invention, the frame is made into a substantially U shape so that, during vibration, its free-end side and fixed-end side both deform simultaneously in such a way as to open or close the opening of the frame. FIG. 1 (a) is a schematic drawing showing the bending moments that act upon ends 21, 22, 31, 32 on a free-end side 20 and fixed-end side 30 of a substantially U-shaped frame 10 constituting a power generation element 1, where the rotational direction of the bending moment M2 that acts upon an area near a bent location 40 of the frame 10 on the fixed-end side 30 is opposite the rotational direction of the bending moment M1 that acts upon a location near the bent location 40 of the frame 10 on the free-end side 20, and therefore the two moments virtually cancel out each other near the bent location 40. As a result, the bending moment M3 that acts upon the end (rigidly supported location 50) on the fixed-end side becomes smaller, and consequently the fixed-end loss, or dissipation to the outside from the fixed end 32, is suppressed and the frame 10 vibrates for a long time. To amply achieve such effect of cancelling out at the free-end side 20 and fixed-end side 30 the bending moments that act upon areas near the bent location 40, the shape of the free-end side 20 and that of the fixed-end side 30 of the frame 10 must be made as identical as possible. For example, desirably the free-end side 20 and fixed-end side 30 have the same length, or both have the same material and section shape.

Even if the free-end side 20 and fixed-end side 30 of the frame 10 have exactly the same shape and material, however, it is practically difficult to completely cancel out (eliminate) on the free-end side 20 and fixed-end side 30 the bending moments that act upon areas near the bent location 40, because a first power generation part 60 may be provided on the free-end side 20 and a permanent magnet 70 may be placed on the fixed-end side 30, for example, in which case it is difficult to completely match the installation positions of these elements that affect bending moments. However, it is amply possible to virtually cancel out the bending moments that act upon areas near the bent location 40, by adjusting, as deemed appropriate, the installation position, weight, dimensions, etc., of each element that affects bending moments.

Also, FIG. 1 (b) is a schematic drawing showing the bending moments M and shearing force Q that act upon the end 32 on the fixed-end side 30 of the substantially U-shaped frame 10 constituting the power generation element 1. According to the present invention, the frame 10 is made into a substantially U shape to suppress generation of bending moments M and shearing force Q at the end 32 on the fixed-end side 30, so as to minimize any deformation of the end 32 on the fixed-end side 30 caused by them. This minimizes dissipation of kinetic energy and allows vibration to last long.

It should be noted that, unlike in FIG. 1 (*a*), the end 22 on the free-end side 20 to which an external force is applied is positioned directly above the rigidly supported location 50 in FIG. 1 (*b*), the purpose of which is to keep the bending moment M3 and shearing force Q that generate at the rigidly supported location 50 as small as possible.

Also according to the present invention, the magnet 70 is placed only on one of inner side faces 11, 12 of the frame 10 (such as only on the bottom inner side face 12), to provide a gap 13 between the other inner side face (such as the top inner side face 11) and the magnet 70. As described above, according to the present invention the free-end side 20 and fixed-end side 30 of the frame 10 deform simultaneously in such a way as to open or close an opening 14 during vibration, at which time the width (height in the vertical direction) of the gap 13 changes by increasing or decreasing.

For example, the width of the gap 13 increases while the frame 10 is deformed in such a way that its opening 14 opens. This means that the magnetic reluctance of the magnetic circuit comprising the magnet 70, first magnetostrictive rod 61 and back yoke 15 increases, and this increase in magnetic reluctance causes a bias magnetic flux 80 to decrease and the magnetic flux through a first coil 62 also decreases. On the other hand, the width of the gap 13 decreases while the frame 10 is deformed in such a way that its opening 14 closes. This means that the magnetic reluctance decreases, and this decrease in magnetic reluctance causes the bias magnetic flux 80 to increase and the magnetic flux through the first coil 62 also increases. By also decreasing/increasing the bias magnetic flux 80 this way as the frame 10 vibrates, the magnetic flux through the first coil 62 changes temporally and the amount of power generation can be increased as a result.

Additionally, when the first power generation part is installed on the free-end side of the frame, by installing the first magnetostrictive rod 61 at a position farther away than a first magnetic rod 63 from the straight line (axis of symmetry) that runs through the bent location 40 and divides the frame 10 equally into the free-end side 20 and fixed-end side 30, the magnetic flux through the first coil 62 decreases while the frame is deformed in such a way that its opening 14 opens, as a result of contraction caused by the compressive stress generating in the first magnetostrictive rod 61. On the other hand, the magnetic flux through the first coil 62 increases while the frame is deformed in such a way that its opening 14 closes, as a result of extension caused by the tensile stress generating in the first magnetostrictive rod 61.

Or, when a first power generation part 200 is installed at a bent location 10*a* of a frame 10, installing a magnetostrictive rod 201 on an outer side face 18 of the frame 10 and a magnetic rod 202 on an inner side face 19 of the frame 10, as shown in FIG. 11, allows the decrease/increase in the magnetic flux due to the increase/decrease in the width of the gap 13 to match the decrease/increase in the magnetic flux due to the change in the compressive stress/tensile stress generating in the magnetostrictive rod 201, which has the effect of increasing the power generation amount as a result of the synergistic effect of both.

Furthermore, according to the present invention the magnet 70 is placed only on one inner side face 11 or 12 of the frame 10. This means that, unlike before, thermal energy does not generate due to friction caused by an inertial force acting upon the magnet placed on a side face of the frame during vibration, and this suppresses dissipation of kinetic energy and vibration lasts long as a result.

Also because the magnet, conventionally placed near both ends of the magnetostrictive element on a side face of the frame, is placed on one inner side face 11 or 12 of the frame 10 according to the present invention, the first magnetostrictive rod 61 can be firmly joined to the frame 10 using solder or brazing 90 by utilizing the position where the magnet 70 is conventionally placed. FIG. 2 shows an example of how the first magnetostrictive rod 61 and frame 10 are joined, and in FIG. 2 (*a*), a concave part 16 is provided by cutting out the top of the frame 10 in the longitudinal direction, while grooves 16*a* are formed in the front and rear interior walls of the concave part 16. Then, the front and rear ends of the first magnetostrictive rod 61 are fitted into the front and rear grooves 16*a* and joined from the side face of the frame 10 using solder or brazing 90. As described above, the position where solder or brazing 90 is applied is where the magnet is conventionally placed, and the present invention allows for such firm joining method because the magnet 70 is placed on one inner side face 11 or 12 of the frame 10.

Also, conventionally adhesive is used for joining the first magnetostrictive rod 61 and frame 10, which presents the problem of adhesive flowing out of the groove and adhering to the coil, thereby allowing some kinetic energy to be used for motion of the coil; according to the present invention, however, use of soldering or brazing is possible and therefore adhesion of the first coil 62 is prevented, which in turn prevents dissipation of kinetic energy and allows the vibration to last longer. It should be noted that the joining strength between the first magnetostrictive rod 61 and frame 10 can be increased further by forming a groove 17 extending in the vertical direction on a side face of the frame 10 and filling this groove 17 with solder or brazing 90, as shown in FIGS. 2 (*b*) and (*c*), or by covering a metal rod 91 buried in the groove 17 with solder or brazing 90, as shown in FIG. 2 (*d*).

It is also possible to join the first magnetostrictive rod 61 and frame 10 by welding W, as shown in FIG. 2 (*e*), or using bolts B, as shown in FIG. 2 (*f*).

Additionally, placing the first power generation part 60 (first magnetostrictive rod 61 and first magnetic rod 63) and a second power generation part 100 (second magnetostrictive rod 101 and second magnetic rod 103; refer to FIG. 8) in line symmetry with respect to the axis of symmetry L is desirable from the viewpoint of making the extent of deformation (deflection amount) of the free-end side 20 as equal as possible to that of the fixed-end side 30 during vibration so that the bending moments and shearing forces that act upon areas near the bent location 40 are cancelled out on the free-end side 20 and fixed-end side 30. Another advantage is that the first magnetostrictive rod 61 and second magnetostrictive rod 101 extend/contract simultaneously.

Additionally, when a weight 110 is attached to the end on the free-end side 20 (refer to FIG. 6), the weight 110, once it starts vibrating, continues to vibrate for a long time due to an inertial force and this helps sustain the vibration of the frame 10 for a long time. It should be noted that desirably the weight 110 is placed as close as possible to the end 32 on the fixed-end side, such as immediately above the end 32 on the fixed-end side. This is because placing the weight 110 directly above the end 32 on the fixed-end side causes the inertial force of the weight 110 to act upon the end on the fixed-end side 30 in the vertical direction, which means that virtually no bending moment or shearing force generates at this end 32 to prevent fixed-end loss at this end 32.

Additionally, when two power generation elements 3 are turned into one power generation element by connecting together their free-end sides 20 and fixed-end sides 30, respectively, (refer to FIG. 9), these two power generation elements 3 deform symmetrically across the connected locations. Accordingly, the bending moment generating at the end 32 on the fixed-end side can be reduced to virtually zero, which makes it possible to almost entirely prevent fixed-end loss caused by bending moment or shearing force from occurring at this end 32.

It should be noted that the external force that may act upon the power generation element proposed by the present invention takes various forms, such as impact force that applies when a part of the power generation element is hit, restorative force that applies after a part of the power generation element has undergone elastic deformation, inertial force that generates when vibration or impact is given to the entire power generation element, magnetic force that applies when the magnet and a part of the power generation element are magnetized, and fluid force that applies when wind or water is caused to collide with the power generation element.

Additionally, the power generation element proposed by the present invention can also be used as an actuator 120 (refer to FIG. 20). To be specific, it can be used as an actuator 120 having a structure identical to that of the aforementioned power generation element 1, wherein the actuator is such that, when electrical current is supplied to the first coil 62 to extend/contract the first magnetostrictive rod 61, the free-end side 20 and fixed-end side 30 vibrate.

BRIEF DESCRIPTION OF THE DRAWINGS

FIG. 1 Schematic drawings (a) and (b), each showing the bending moments and shearing forces that act upon the respective ends on the free-end side and fixed-end side of the frame FIG. 2 Drawings (a) through (f), each showing a state of the first magnetostrictive rod joined to the frame by means of soldering, brazing, etc.

FIG. 3 Schematic structural drawings (a) and (b) of the power generation element in a first embodiment FIG. 4 Drawings (a) and (b), each showing a deformed state of the frame FIG. 5 Schematic structural drawing of the power generation element in a second embodiment FIG. 6 Schematic structural drawings (a) and (b) of the power generation element in a third embodiment FIG. 7 Schematic structural drawing of the power generation element in a fourth embodiment FIG. 8 Schematic structural drawing of the power generation element in a fifth embodiment FIG. 9 Schematic structural drawing of the power generation element in a sixth embodiment FIG. 10 Schematic structural drawing, showing a state of the frame rigidly supported at an angle FIG. 11 Schematic structural drawing of the power generation element in a seventh embodiment FIG. 12 Schematic structural drawing, showing another constitutional example of the power generation element in the seventh embodiment FIG. 13 Schematic structural drawing of the power generation element in an eighth embodiment FIG. 14 Schematic structural drawing of Variation Example 1 of the power generation element in the eighth embodiment FIG. 15 Schematic structural drawing of Variation Example 2 of the power generation element in the eighth embodiment FIG. 16 Schematic structural drawing of the power generation element in a ninth embodiment FIG. 17 Schematic plan view (a) and schematic side view (b) of the power generation element in a tenth embodiment FIG. 18 Schematic plan view (a) and schematic side view (b) of the power generation element in an eleventh embodiment FIG. 19 Schematic side view (a) and schematic perspective view (b) of the power generation element in a twelfth embodiment FIG. 20 Schematic constitutional drawing of an actuator FIG. 21 Side view (a) and plan view (b), each showing a rough constitution of a conventional power generation element

MODE FOR CARRYING OUT THE INVENTION

[First Embodiment]

Next, the first embodiment of the power generation element proposed by the present invention is explained.

As shown in FIG. 3 (a), a power generation element 1 conforming to the present invention is roughly constituted by a first power generation part 60, frame 10, and magnet 70.

The first power generation part 60 is provided to generate power using the inverse magnetostrictive effect on the free-end side 20 of the frame 10, and is roughly constituted by a first magnetostrictive rod 61, first coil 62, and first magnetic rod 63.

The first magnetostrictive rod 61 is a rod-like member constituted by magnetic material. The type of magnetic material is not limited in any way, but Galfenol, which is an iron gallium alloy, may be used, or it may be Permendur, which is an iron cobalt alloy, or other material, for example. Additionally, not only crystalline material, but amorphous material may also be used. Furthermore, magnetostrictive material to which compressive stress has been added beforehand by stress annealing, may be used to increase the magnetization change relative to the tensile stress. Preferably the first magnetostrictive rod 61 is constituted by magnetic material having ductility because it contracts/extends by receiving an external force, the details of which will be explained later. The first magnetostrictive rod 61 only needs to have a rod-like shape, examples of which include rectangular solid and column.

The first coil 62 is wound around the first magnetostrictive rod 61, and generates voltage in proportion to the temporal change in the magnetic flux passing through the first magnetostrictive rod 61 according to the law of electromagnetic induction.

The material of the first coil 62 is not limited in any way, but copper wire may be used, for example. Additionally, the voltage level can be adjusted by changing the number of windings of the first coil 62.

The first magnetic rod 63, assuming a parallel beam structure where it is placed in parallel with the first magnetostrictive rod 61, has appropriate rigidity and shape to be able to apply a uniform compressive force or tensile force to a section of the first magnetostrictive rod 61. To be specific, it has the rigidity and shape needed to cause the neutral axis (axis that does not contract/extend under zero stress) to position outside the section of the first magnetostrictive rod 61 when this parallel beam structure deflects due to application of an external force.

The frame 10 is made of magnetic material bent in a substantially ⊐ U shape. The frame 10 is rigidly supported in a state of the so-called cantilever beam, where its longitudinal direction lies roughly horizontal and its one end and other end across the bent location 40 constitute a fixed end and free end, respectively. Under the present invention, the "substantially U shape" includes the so-called "U shape" where the frame 10 curves along a gradual curve from the free-end side 20 to the fixed-end side 30, and the so-called "V shape" where the gap between the free-end side 20 and fixed-end side 30 widens gradually from the bent location 40 toward the end 22 on the free-end side and the end 32 on the fixed-end side.

To fully achieve the effect of the present invention of "cancelling out the bending moments and shearing forces that act upon areas near the bent location on the free-end side of the frame, with the bending moments and shearing forces that act upon areas near the bent location on the fixed-end side," the most preferable frame shape is one that has two bending points at which it bends by virtually a right angle or close to a right angle; under the present invention, however, U shapes having no clear bending points, V shapes having one bending point, and even multi-step shapes having three or more bending points, are included in the "substantially U shape" in the broad sense of the term so long as the aforementioned effect of cancelling out the moments and shearing forces can be achieved.

As mentioned above, the first power generation part 60 is installed on the free-end side 20 of the frame 10; to be more specific, it is installed in such a way that the first magnetostrictive rod 61 is positioned farther away (positioned away from the straight line) than the first magnetic rod 63, from the straight line L that runs through the bent location 40 and divides the frame 10 equally into the free-end side 20 and fixed-end side 30.

Of two opposing inner side faces 11, 12 of the frame 10, the magnet 70 is placed on the bottom inner side face 12. By installing the magnet 70 only on the bottom inner side face 12, a gap 13 is provided between the magnet 70 and the top inner side face 11. It should be noted that the magnet 70 can be placed only on the top inner side face 11.

As mentioned above, the frame 10 is made of magnetic material and therefore a part of the frame 10 (from near the installation position of the magnet 70 to near the front end of the magnetostrictive rod 61) functions as a back yoke 15 and, as the magnetic flux from the magnet 70 passes through the first magnetostrictive rod 61 and back yoke 15, one magnetic circuit is formed. It should be noted that, while a permanent magnet 70 is used as the magnet 70 in this embodiment, the type of magnet is not limited to this and an electromagnet can also be used, for example. Also, only the part of the entire frame 10 that functions as a back yoke 15 can be constituted by magnetic material; however, from the viewpoint of cancelling out on the free-end side 20 and fixed-end side 30 the bending moments and shearing forces that act upon a point near the bent location 40, preferably the free-end side 20 and fixed-end side 30 are made of the same material if at all possible, which, in practicality, means that the entire frame 10 is preferably made of homogeneous magnetic material.

When an external force is applied to the power generation element 1 having such structure, both the free-end side 20 and fixed-end side 30 vibrate and inductive voltage (or inductive current) generates in the first coil 62 due to the inverse magnetostrictive effect, and power is generated as a result.

To be specific, the substantially U-shaped frame 10 is deemed to have a cantilever beam structure where its end 32 on the fixed-end side is rigidly supported by a fixing member. When an external force is applied to its end 22 on the free-end side, the free-end side 20 and fixed-end side 30 deform roughly in line symmetry across the straight line L that runs through the bent location 40 and divides the frame 10 equally into the free-end side 20 and fixed-end side 30. This means that, when the free-end side 20 of the frame 10 deflects upward, the fixed-end side 30 deflects downward in line symmetry, as shown in FIG. 4 (*a*); when the free-end side 20 deflects downward, on the other hand, the fixed-end side 30 deflects upward in line symmetry, as shown in FIG. 4 (*b*). In other words, both the free-end side 20 and fixed-end side 30 of the substantially U-shaped frame 10 deform simultaneously in such a way as to open or close the opening 14.

Now, when the free-end side 20 is deflecting downward (deformed so that the opening 14 closes), for example, a tensile stress corresponding to bending moment generates in the entire section of the first magnetostrictive rod 61 as a result of this and the first magnetostrictive rod 61 extends. When this happens, a compressive stress corresponding to bending moment generates in the entire section of the first magnetic rod 63 and the first magnetic rod 63 contracts.

When the free-end side 20 is deflecting upward, on the other hand, a compressive stress corresponding to bending moment generates in the entire section of the first magnetostrictive rod 61 as a result of this and the first magnetostrictive rod 61 contracts. When this happens, a tensile stress corresponding to bending moment generates in the entire section of the first magnetic rod 63 and the first magnetic rod 63 extends.

This way, or specifically as the frame 10 vibrates and accordingly the first magnetostrictive rod 61 generates a tensile/compressive stress and extends/contracts as a result, the magnetization of the first magnetostrictive rod 61 increases/decreases due to the inverse magnetostrictive effect, and the magnetic flux through the first coil 62 wound around the first magnetostrictive rod 61 also increases/decreases. Because of this temporal change in magnetic flux, inductive voltage (or inductive current) generates in the first coil 62. Since the frame 10 of cantilever beam structure bends and vibrates as an external force is applied, continuous power generation is possible through resonance.

It should be noted that, while in this embodiment the first magnetostrictive rod 61 is installed at a position farther away than the first magnetic rod 63 from the straight line L that runs through the bent location 40 and divides the frame 10 equally into the free-end side 20 and fixed-end side 30, the first magnetostrictive rod 61 can also be installed at a position closer to it than the first magnetic rod 63, as shown in FIG. 3 (*b*).

[Second Embodiment]

Next, the second embodiment of the power generation element proposed by the present invention is explained; it should be noted that those locations that are structurally identical to the first embodiment are denoted by the same symbols and not explained.

As shown in FIG. 5, a power generation element 2 in this embodiment is characterized in that the end 22 on the free-end side of the frame 10 is bent upward.

The aforementioned first embodiment represents a structure suitable in situations where an external force is applied along the vertical direction to the free-end side 20 of the frame 10; this embodiment, on the other hand, represents a structure suitable in situations where an external force is applied along the horizontal direction to the end 22 on the free-end side. When an external force acts upon the end 22 on the free-end side from the horizontal direction, a bending moment acts upon an upward bent location 22*a* and this bending moment causes the entire frame 10 to vibrate, and a tensile/compressive stress acts upon the first magnetostrictive rod 61 as a result.

It should be noted that, although not illustrated, the bending moment and shearing force that generate at the rigidly supported location 50 can be minimized by positioning the end 22 of the free-end side 20 directly above the rigidly supported location 50, as in FIG. 1 (b).

[Third Embodiment]

Next, the third embodiment of the power generation element proposed by the present invention is explained; it should be noted that those locations that are structurally identical to each of the aforementioned embodiments are denoted by the same symbols and not explained.

As shown in FIG. 6 (a), a power generation element 3 in this embodiment is characterized in that the end 32 on the fixed-end side of the frame 10 is rigidly supported on a vibrating body B and that a weight 110 is fixed at the end 22 on the free-end side.

In this case, an external force is applied to the end 32 on the fixed-end side; however, both the free-end side 20 and fixed-end side 30 of the frame 10 deform simultaneously in such a way as to open or close the opening 14, just like in each of the aforementioned embodiments. By attaching the weight 110 to the end 22 on the free-end side, the weight 110, once it starts vibrating, continues to vibrate for a long time due to inertial force and therefore the vibration of the entire frame 10 can be sustained for a long time. It should be noted that the structure may also be such that the power generation element 3 is rigidly supported on the vibrating body B without the weight 110.

Also, as shown in FIG. 6 (b), a large impact force F can be applied to the end 32 on the fixed-end side in the vertical direction to cause a large inertial force to act upon the weight 110 and thereby vibrate the frame 10.

[Fourth Embodiment]

Next, the fourth embodiment of the power generation element proposed by the present invention is explained; it should be noted that those locations that are structurally identical to each of the aforementioned embodiments are denoted by the same symbols and not explained.

As shown in FIG. 7, a power generation element 4 in this embodiment has a magnet 130 at the end 22 on the free-end side and this magnet 130 is structured in such a way that it can be freely detached and attached from/to the end on the fixed-end side 30 using a known switch mechanism 131. To remove the magnet 130 magnetized to the fixed-end side 30, a mechanism is provided whereby, for example, a rod-like member 131a is pivotally supported, as a switch mechanism, on the fixed-end side 30 in a manner rotatable in the vertical direction and the tip of the rod-like member 131a is sprung up together with the magnet 130 by utilizing the principle of leverage.

By providing a structure that allows the magnet 130 to be freely detached and attached using the switch mechanism 131, power can be easily obtained with a one-click action of turning on/off the switch.

[Fifth Embodiment]

Next, the fifth embodiment of the power generation element proposed by the present invention is explained; it should be noted that those locations that are structurally identical to each of the aforementioned embodiments are denoted by the same symbols and not explained.

As shown in FIG. 8, a power generation element 5 in this embodiment is characterized in that it has a second power generation part 100.

The second power generation part 100 is roughly constituted by a second magnetostrictive rod 101 made of magnetostrictive material, second coil 102 wound around the second magnetostrictive rod 101, and second magnetic rod 103 having appropriate rigidity and shape to apply a uniform compressive force or tensile force to the second magnetostrictive rod 101 and placed in parallel with the second magnetostrictive rod 101.

The second power generation part 100 is installed on the fixed-end side 30, where the first magnetostrictive rod 61, first magnetic rod 63, second magnetostrictive rod 101 and second magnetic rod 103 are placed in line symmetry relative to the aforementioned axis of symmetry L. To be specific, the first magnetostrictive rod 61, first magnetic rod 63, axis of symmetry L, second magnetic rod 103, and second magnetostrictive rod 101 are placed, in this order, from top to bottom.

By giving the first power generation part 60 and second power generation part 100 an internal structure which is line-symmetrical with respect to the axis of symmetry L, the amounts of deformation (deflection amount) that occur on the free-end side 20 and fixed-end side 30 during vibration can be made as equal as possible, so that the bending moments and shearing forces that act upon near the bent location 40 can be cancelled out on the free-end side 20 and fixed-end side 30 in an effective manner.

It should be noted that the power generation element 5 in this embodiment can be combined with the upward bending of the end 22 on the free-end side shown in the second embodiment, or the attachment of the vibrating body B and weight 110 shown in the third embodiment, or the switch mechanism 131 shown in the fourth embodiment.

[Sixth Embodiment]

Next, the sixth embodiment of the power generation element proposed by the present invention is explained; it should be noted that those locations that are structurally identical to each of the aforementioned embodiments are denoted by the same symbols and not explained.

As shown in FIG. 9, a power generation element 6 in this embodiment is characterized in that it has two power generation elements 3 identical to that shown in the third embodiment, which share the same weight 110, and that the free-end sides 20 and fixed-end sides 30 of the respective power generation elements 3 are connected together.

Having this structure, the two power generation elements 3 deform symmetrically across the connected locations in such a way that the bending moments and shearing forces generating at the end 32 on the fixed-end side are brought as close as possible to zero, and this almost completely prevents fixed-end loss from occurring at this end 32. It should be noted that the power generation element 6 may be structured not to have a weight 110.

An external force that would be applied to the power generation element proposed by the present invention is not always applied from the direction orthogonal to the longitudinal direction of the frame 10, and in some cases it may be applied from a direction oblique to the longitudinal direction of the frame 10. When an external force is applied from an oblique direction, the external force is divided into a component along the longitudinal direction of the frame 10 and a component orthogonal to the longitudinal direction, and the external force component orthogonal to the longitudinal direction gives vibration to the frame 10 to achieve the aforementioned effect. Also, in each of the aforementioned embodiments, the end 32 on the fixed-end side is rigidly supported in such a way that the longitudinal direction of the frame 10 extends in the horizontal direction;

however, the present invention is not limited to the foregoing and this end can be rigidly supported in such a way that the longitudinal direction of the frame 10 extends obliquely to the horizontal direction, as shown in FIG. 10.

[Seventh Embodiment]

Next, the seventh embodiment of the power generation element proposed by the present invention is explained; it should be noted that those locations that are structurally identical to each of the aforementioned embodiments are denoted by the same symbols and not explained.

As shown in FIG. 11, a power generation element 7 in this embodiment is characterized in that a first power generation part 200 is installed at a bent location 10a of the frame 10, a first magnetostrictive rod 201 is installed on an outer side face 18 of the frame 10, and a first magnetic rod 202 is installed on an inner side face 19 of the frame 10.

An external force can be applied to the power generation element 7 at the end 22 on the free-end side 20, or by using a vibrating body (not illustrated) installed at the end 32 on the fixed-end side 30.

This structure causes the first magnetostrictive rod 201 to contract due to a compressive stress while the opening 14 is open as a result of deformation and the magnetic flux through a first coil 203 decreases, as mentioned above. While the opening 14 is closed as a result of deformation, on the other hand, the first magnetostrictive rod 201 extends due to a tensile stress and the magnetic flux through the first coil 203 increases, and consequently the decrease/increase in the magnetic flux due to an increase/decrease in the width of the gap 13 agrees with the decrease/increase in the magnetic flux due to the change in the compressive stress/tensile stress generating in the first magnetostrictive rod 201.

In addition, providing the first power generation part 200 at the bent location 10a allows only the bending moment that curves the first power generation part 200 to act upon the first power generation part 200 due to the force that applies vertically to the longitudinal direction of the free-end side 20 during vibration, and this improves the power generation efficiency.

Additionally, as an example combining the fifth embodiment and seventh embodiment as illustrated in FIG. 12, first power generation parts 200a, 200b can be installed on the free-end side 20 and at the bent location 10a of the frame 10, respectively, with a second power generation part 204 installed on the fixed-end side 30.

[Eighth Embodiment]

Next, the eighth embodiment of the power generation element proposed by the present invention is explained; it should be noted that those locations that are structurally identical to each of the aforementioned embodiments are denoted by the same symbols and not explained.

As shown in FIG. 13, a power generation element 8 in this embodiment is characterized in that two power generation elements 300a, 300b, each comprising the first power generation part 200 like the one shown in the seventh embodiment being installed at the bent location 10a of the frame, are placed in a manner facing each other and both power generation elements share the same fixed ends 301a, 301b, with weights 302a, 302b of an identical mass attached to the ends on the respective free-end sides.

According to the power generation element 8 in this embodiment, moments are applied to the fixed ends 301a, 301b in opposite directions during vibration, thereby cancelling each other out and thus allowing the vibration to last for a long time due to the so-called principle of a tuning fork.

FIG. 14 shows Variation Example 1, where weights 303a, 303b of different masses cause the entire power generation element to resonate at two different natural vibration frequencies and this structure widens the band of frequencies at which power can be generated at high efficiency.

Also, FIG. 15 shows Variation Example 2, where magnets 304a, 304b are placed in a manner facing each other on the side faces of the weights 302a, 302b, which causes the spring property to become non-linear due to attraction and repulsion caused by magnetic force and this widens the band of frequencies at which power can be generated at high efficiency.

[Ninth Embodiment]

Next, the ninth embodiment of the power generation element proposed by the present invention is explained; it should be noted that those locations that are structurally identical to each of the aforementioned embodiments are denoted by the same symbols and not explained.

As shown in FIG. 16, a power generation element 9 in this embodiment is characterized in that it has a magnet 305 at the end 22 on the free-end side 20, as well as a switch plate 306 extending in the longitudinal direction from a part on the fixed-end side 30.

The switch plate 306 is structurally detachable/attachable from/to the magnet 305, and the mechanism is such that, when the switch plate 306 is pushed down as shown by the arrow in a state where the magnet 305 is attached to the switch plate 306, the attractive force is released and the free-end side 20 springs up, to cause vibration.

Also with the power generation element 9 in this embodiment, power can be easily obtained with a one-click action of turning on/off the switch, like the one shown in the fourth embodiment.

[Tenth Embodiment]

Next, the tenth embodiment of the power generation element proposed by the present invention is explained; it should be noted that those locations that are structurally identical to each of the aforementioned embodiments are denoted by the same symbols and not explained.

As shown in FIGS. 17 (a) and (b), a power generation element 400a in this embodiment is characterized in that, in its power generation part 404 constituted by a first magnetostrictive rod 401, first coil 402 and first magnetic rod 403, the first magnetostrictive rod 401 is divided into two in the width direction (lateral direction).

Such structure can be adopted because of a unique effect of the present invention, which is that no magnet has to be placed on a side face of the frame 10, and even when one of the left and right first magnetostrictive rods (such as a left magnetostrictive rod 401a) is cracked, chipped or otherwise damaged, or separates from the joined location, or otherwise stops functioning, the other first magnetostrictive rod (such as a right magnetostrictive rod 401b) is still functioning and therefore the power generation element 400a can be prevented from becoming unusable, although its performance drops.

Also, the period during which the power generation element 400a is disabled can be shortened because all that is needed is to prepare a replacement for, and replace, the damaged first magnetostrictive rod 401a while the other first magnetostrictive rod 401b alone is operating the element.

In addition, generally a magnetostrictive rod is produced by cutting a strip-shaped sheet from a round bar, which puts manufacturing limitations on the width of the rod. According to this embodiment, however, where two magnetostrictive rods are combined in the width direction and used as one magnetostrictive rod, a wide power generation element can be obtained.

[Eleventh Embodiment]

Next, the eleventh embodiment of the power generation element proposed by the present invention is explained; it should be noted that those locations that are structurally identical to each of the aforementioned embodiments are denoted by the same symbols and not explained.

As shown in FIG. 18, a power generation element 400b in this embodiment is characterized in that first coils 405a, 405b are respectively wound around the two magnetostrictive rods 401a, 401b on the left and right as shown in the tenth embodiment.

This way, even when one of the left and right first coils (such as the left first coil 405a) breaks, short-circuits or otherwise stops functioning, the other first coil (such as the right first coil 405b) is still functioning and therefore the power generation element 400b can be prevented from becoming unusable, although its performance drops.

Also, the period during which the power generation element 400b is disabled can be shortened because all that is needed is to prepare a replacement for, and replace, the damaged first coil 405a while the other first coil 405b alone is operating the element.

It should be noted that the constitution where the first magnetostrictive rod 401 is divided in the width direction as shown in the tenth embodiment, or the constitution where the first coils 405a, 405b are respectively wound around the first magnetostrictive rods 401a, 401b as shown in the eleventh embodiment, can be adopted to the power generation element having its first power generation part at the bent location as shown in the seventh or eighth embodiment.

[Twelfth Embodiment]

Next, the twelfth embodiment of the power generation element proposed by the present invention is explained; it should be noted that those locations that are structurally identical to each of the aforementioned embodiments are denoted by the same symbols and not explained.

As shown in FIG. 19, a power generation element 500 in this embodiment is characterized in that two power generation elements 500a, 500b are placed in parallel in the lateral direction and their respective free ends and fixed ends are connected by plate bodies 501a, 501b (vibration plates).

To be specific, the rear ends of the frames on the free-end sides and fixed-end sides of the power generation elements 500a, 500b are shortened and joined to the vibration plates 501a, 501b which are sized in such a way that they extend rearward from these rear ends.

The vibration plates 501a, 501b are constituted by metal, resin, or other material having spring property. The resonance frequency can be adjusted by changing the spring characteristics with the dimensions (length and thickness) of the vibration plates 501a, 501b or through attachment of a weight to the vibration plates.

In the aforementioned embodiments, a part of the frame is bent, or the frames of two power generation elements are joined together, or an impact force, restorative force, inertial force, magnetic force, fluid force, etc., is given to the frame; in this embodiment, however, the functions of the frame to be manipulated this way are given to the vibration plates.

While two power generation elements are arranged side by side in the lateral direction in this embodiment, the present invention is not limited to this and three or more power generation elements can be arranged side by side.

Next, an actuator 120 proposed by the present invention is explained.

As shown in FIG. 20, the actuator 120 proposed by the present invention has a structure identical to that of the power generation element 1 shown in the first embodiment.

It should be noted that, for the convenience of explanation, the names of the elements constituting the power generation element 1 are used directly to refer to the elements constituting the actuator 120.

In other words, the actuator 120 is roughly constituted by the first magnetostrictive rod 61, first coil 62, first magnetic rod 63, frame 10, and magnet 70, wherein electrical current is supplied to the first coil 62 to extend/contract the first magnetostrictive rod 61 and thereby cause the free-end side 20 to vibrate first. The mechanism is that the vibration of the free-end side 20 is then transmitted across the bent location 40 to the fixed-end side 30, and as time passes, the free-end side 20 and fixed-end side 30 resonate and the vibration is maintained.

It should be noted that the actuator 120 proposed by the present invention is not limited to the power generation element 1 shown in the first embodiment, and its structure may be the same as that of the power generation element shown in any of the aforementioned embodiments.

INDUSTRIAL FIELD OF APPLICATION

The present invention can be applied in industrial fields as it relates to a power generation element that suppresses loss of kinetic energy during vibration and thereby allows the vibration to last long, as well as an actuator that uses the structure of the power generation element.

DESCRIPTION OF THE SYMBOLS

B Vibration body
F Impact force
L Straight line (axis of symmetry)
1 Power generation element
2 Power generation element
3 Power generation element
4 Power generation element
5 Power generation element
6 Power generation element
7 Power generation element
8 Power generation element
9 Power generation element
10 Frame
10a Bent location
11 Inner side face
12 Inner side face
13 Gap
14 Opening
15 Back yoke
16 Concave part
16a Groove
17 Groove
18 Outer side face
19 Inner side face
20 Free-end side
21 End
22 End
22a Bent location
30 Fixed-end side
31 End
32 End
40 Bent location
50 Rigidly supported location
60 First power generation part
61 First magnetostrictive rod
62 First coil
63 First magnetic rod 70 Magnet
80 Bias magnetic flux
90 Solder or brazing
91 Metal rod
100 Second power generation part
101 Second magnetostrictive rod
103 Second magnetic rod
110 Weight
120 Actuator
130 Magnet
131 Switch mechanism
131a Rod-like member
200 First power generation part
201 First magnetostrictive rod
202 First magnetic rod
203 First coil
204 Second power generation part
300a, 300b Power generation element
301a, 301b Fixed end
302a, 302b Weight
303a, 303b Weight
304a, 304b Magnet
305 Magnet
306 Switch plate
400a Power generation element
400b Power generation element
401 First magnetostrictive rod
402 First coil
403 First magnetic rod
404 First power generation part
405a, 405b First coil
500 Power generation element
500a, 500b Power generation element
501a, 501b Vibration plate

What is claimed is:

1. A power generation element of inverse magnetostrictive type characterized by having: a first power generation part comprising a first magnetostrictive rod made of magnetostrictive material, a first coil wound around the first magnetostrictive rod, and a first magnetic rod having appropriate rigidity and shape to apply a uniform compressive force or tensile force to the first magnetostrictive rod and placed in parallel with the first magnetostrictive rod; a frame made of magnetic material bent in a substantially U shape, whose one end and other end across the bent location constitute a fixed end and free end, respectively; and a magnet;

wherein the first power generation part is installed on the free-end side and/or bent location of the frame;

the magnet is placed only on one of two opposing inner side faces of the frame, so that a part of the frame functions as a back yoke and a gap is also formed between the magnet and the inner side face on which the magnet is not placed; and the frame on the free-end side and frame on the fixed-end side vibrate together when an external force is applied.

2. A power generation element according to claim 1, characterized in that, when the first power generation part is installed on the free-end side of the frame, the power generation element has:

a second power generation part comprising a second magnetostrictive rod made of magnetostrictive material, a second coil wound around the second magnetostrictive rod, and a second magnetic rod having appropriate rigidity and shape to apply a uniform compressive force or tensile force to the second magnetostrictive rod and placed in parallel with the second magnetostrictive rod;

the second power generation part is installed on the fixed-end side of the frame; and the first magnetostrictive rod, first magnetic rod, second magnetostrictive rod, and second magnetic rod are placed in line symmetry where an axis of symmetry is a straight line that runs through the bent location and divides the frame equally into the free-end side and fixed-end side.

3. A power generation element according to claim 1, is characterized in that, when the first power generation part is installed on the free-end side of the frame, the magnetostrictive rod is placed at a position farther away than the magnetic rod from a straight line that runs through the bent location and divides the frame equally into the free-end side and fixed-end side.

4. A power generation element according to claim 1, characterized in that, when the first power generation part is installed on the bent location of the frame, the magnetostrictive rod is placed on an outer side face of the frame, while the magnetic rod is placed on an inner side face of the frame.

5. A power generation element according to claim 1, characterized in that the magnetostrictive rod is joined to the frame by soldering, brazing, welding, bolting, or a combination of any of the foregoing.

6. A power generation element according to claim 1, characterized in that, when placed so that a longitudinal direction of the frame lies roughly horizontal, a weight is attached to an end on the free-end side immediately above the fixed end.

7. A power generation element characterized in that it has two power generation elements identical to that according to claim 1 and free-end sides and fixed-end sides of frames of the respective power generation elements are connected together, so that the two power generation elements deform symmetrically across connected locations.

8. An actuator having a structure identical to that of a power generation element according to claim 1, characterized in that, when electrical current is supplied to the coil, the magnetostrictive rod extends/contracts to cause the frame on the free-end side to vibrate.

9. A power generation element according to claim 1, wherein the frame and the magnet are the first frame and the first magnet, respectively, and the power generation element further comprises a second power generation part, a second frame, and a second magnet corresponding to the first power generation part, the first frame, and the first magnet, respectively, wherein the free end of the first frame and a free end of the second frame face each other, and the fixed end of the first frame and a fixed end of the second frame are shared and connected.

10. A power generation element according to claim 1, further comprising a switch plate branching off from the fixed-end side of the frame in parallel to the fixed-end side of the frame, wherein the switch plate is structurally detachable/attachable from/to the magnet such that when the switch plate is pushed down toward the fixed end in a state where the magnet is attached to the switch plate, attractive force is released and the free-end side springs up, causing vibration.

* * * * *